United States Patent [19]
Nguyen

[11] Patent Number: 5,646,560
[45] Date of Patent: Jul. 8, 1997

[54] INTEGRATED LOW-POWER DRIVER FOR A HIGH-CURRENT LASER DIODE

[75] Inventor: Thai Minh Nguyen, Santa Clara, Calif.

[73] Assignee: National Semiconductor Corporation, Santa Clara, Calif.

[21] Appl. No.: 315,652

[22] Filed: Sep. 30, 1994

[51] Int. Cl.$^6$ .................................................. H03K 3/00
[52] U.S. Cl. .......................... 327/109; 327/361; 372/31; 372/38; 330/288
[58] Field of Search ...................................... 327/109, 513, 327/514, 65, 544, 108, 361; 372/31, 29, 32, 33, 34, 38; 330/288

[56] References Cited

U.S. PATENT DOCUMENTS

| | | | |
|---|---|---|---|
| 4,799,224 | 1/1989 | Bottacchi et al. | 372/38 |
| 4,820,940 | 4/1989 | Wachi et al. | 327/110 |
| 4,868,836 | 9/1989 | Howard | 372/38 |
| 4,912,427 | 3/1990 | Rybicki | 330/257 |
| 4,985,896 | 1/1991 | Kimizuka et al. | 372/38 |
| 5,224,112 | 6/1993 | Uesaka | 372/38 |
| 5,309,461 | 5/1994 | Call et al. | 372/38 |
| 5,309,463 | 5/1994 | Kasai | 372/38 |
| 5,315,606 | 5/1994 | Tanaka | 372/38 |
| 5,349,595 | 9/1994 | Ogawa et al. | 372/38 |
| 5,374,898 | 12/1994 | Harvey | 330/254 |
| 5,377,213 | 12/1994 | Honda | 372/38 |
| 5,382,917 | 1/1995 | Miyake et al. | 330/255 |
| 5,391,933 | 2/1995 | Rein | 327/108 |
| 5,412,559 | 5/1995 | Karasawa | 363/127 |

FOREIGN PATENT DOCUMENTS

| | | | |
|---|---|---|---|
| 7145307 | 9/1982 | Japan | 327/110 |

OTHER PUBLICATIONS

Data Sheet from Avantek, a subsidiary of Hewlett–Packard, IDA–07318, MagIC™ Silicon Bipolar MMIC 1.5 Gb/s Laser Diode Driver, Feb., 1992.

*Primary Examiner*—Timothy P. Callahan
*Assistant Examiner*—Kenneth B. Wells
*Attorney, Agent, or Firm*—Skjerven, Morrill, MacPherson, Franklin & Friel; Edward C. Kwok

[57] ABSTRACT

A driver circuit for a laser diode includes a prebiasing amplifier for providing a prebiasing current, a second amplifier for amplifying an input signal to provide an output current signal, and a third amplifier for amplifying the sum of the current output signal and the prebiasing current. In one embodiment, the third amplifier includes first and second current mirrors. In another embodiment, a capacitor couples one output of the second amplifier to an inverting input of the third amplifier, so as to increase the effective gain of the third amplifier.

8 Claims, 5 Drawing Sheets

INTEGRATED LOW-POWER DRIVER FOR A HIGH-CURRENT LASER DIODE

BACKGROUND OF THE INVENTION

1. Field of the Invention

The present invention relates to integrated circuit laser diode drivers; and, in particular, the present invention relates to integrated circuit laser diode drivers suitable for use in high frequency applications, such as fiber optics.

2. Discussion of the Related Art

Laser diodes are widely used in fiber optic data and telecommunication communication applications, such as Fiber Channel, FDDI or SONET. For these applications, laser diodes operate at switching frequencies as high as 2.5 Gb/s. Laser diode drivers for driving such laser diodes are available in integrated circuit form. However, such integrated circuit laser diode drivers require both high overhead supply power and numerous external components.

FIG. 1 shows a laser diode 101 driven by an integrated circuit laser diode driver 150. As shown in FIG. 1, a laser diode 101 is driven by output terminals 112 and 113 of integrated circuit laser diode driver 150. Terminal 112 is the output terminal of a differential amplifier 103 for providing a DC prebiasing current for laser diode 101. Prebiasing allows laser diode 101 to operate close to its threshold current level. Prebiasing minimizes the turn-on delay of laser diode 101 during operation. In one implementation of circuit 100, the DC prebiasing current is approximately 20–80 ma. The prebiasing DC current level in terminal 112 is controlled by a feedback path including photodiode 102 and amplifier 104. The current in photodiode 102 is amplified by amplifier 104 and provided to the inverting input terminal 118 of differential amplifier 103. The non-inverting input terminal of differential amplifier 103 receives at input terminal 119 a relatively constant current from reference current source 111.

A signal to be transmitted by laser diode 101 is received by integrated circuit laser diode driver 150 as a differential signal in terminals 114 and 115. Buffer stage 105 amplifies the differential signal received by terminals 114 and 115 and provides at terminals 116 and 117 a differential signal, which is modulated by differential amplifier 140. Differential amplifier 140 is formed by transistors 107 and 108, and current source 106. Differential amplifier 140 provides at node 120 a modulated unipolar AC signal, which is injected into laser diode 101. External capacitor 110 and external inductor 109 are provided respectively to pass and block the AC signal.

As evident from FIG. 1, the amplitude of the modulated AC current signal injected into laser diode 101 also determines the requisite current in current source 106. Since the current in current source 106 is a static current, the larger this current is, the larger the power dissipation in integrated circuit laser diode driver 150. In one typical configuration of circuit 100, this current is between 5 to 40 ma. An example of such a laser diode driver is the IDA-07318 integrated circuit available from Hewlett-Packard Company.

SUMMARY OF THE INVENTION

In accordance with the present invention, a method and a circuit are provided to drive a laser diode. The circuit of the present invention includes (i) a first amplifier for providing a prebiasing current; (ii) a second amplifier for providing a modulated current signal derived from an input signal; and (iii) a third amplifier receiving the prebiasing current and the modulated signal for providing an output current to flow in the laser diode.

In one embodiment of the present invention, the third amplifier includes a first current mirror for amplifying the prebiasing current, and a second current mirror for amplifying the modulated signal.

In another embodiment, the second amplifier has an output terminal, and the third amplifier has an inverting input terminal, the driver circuit further includes a capacitor coupled between the output terminal of the second amplifier and the inverting input terminal of the third amplifier.

Using the third amplifier, rather than a simple sum of the prebiasing current and the modulated signal of the second amplifier, an integrated circuit laser diode driver of the present invention achieves a lower power dissipation than the integrated circuit laser diode drivers of the prior art.

The present invention is better understood upon consideration of the detailed description below and the accompanying drawings.

DETAILED DESCRIPTION OF THE PREFERRED EMBODIMENTS

Figure 1:
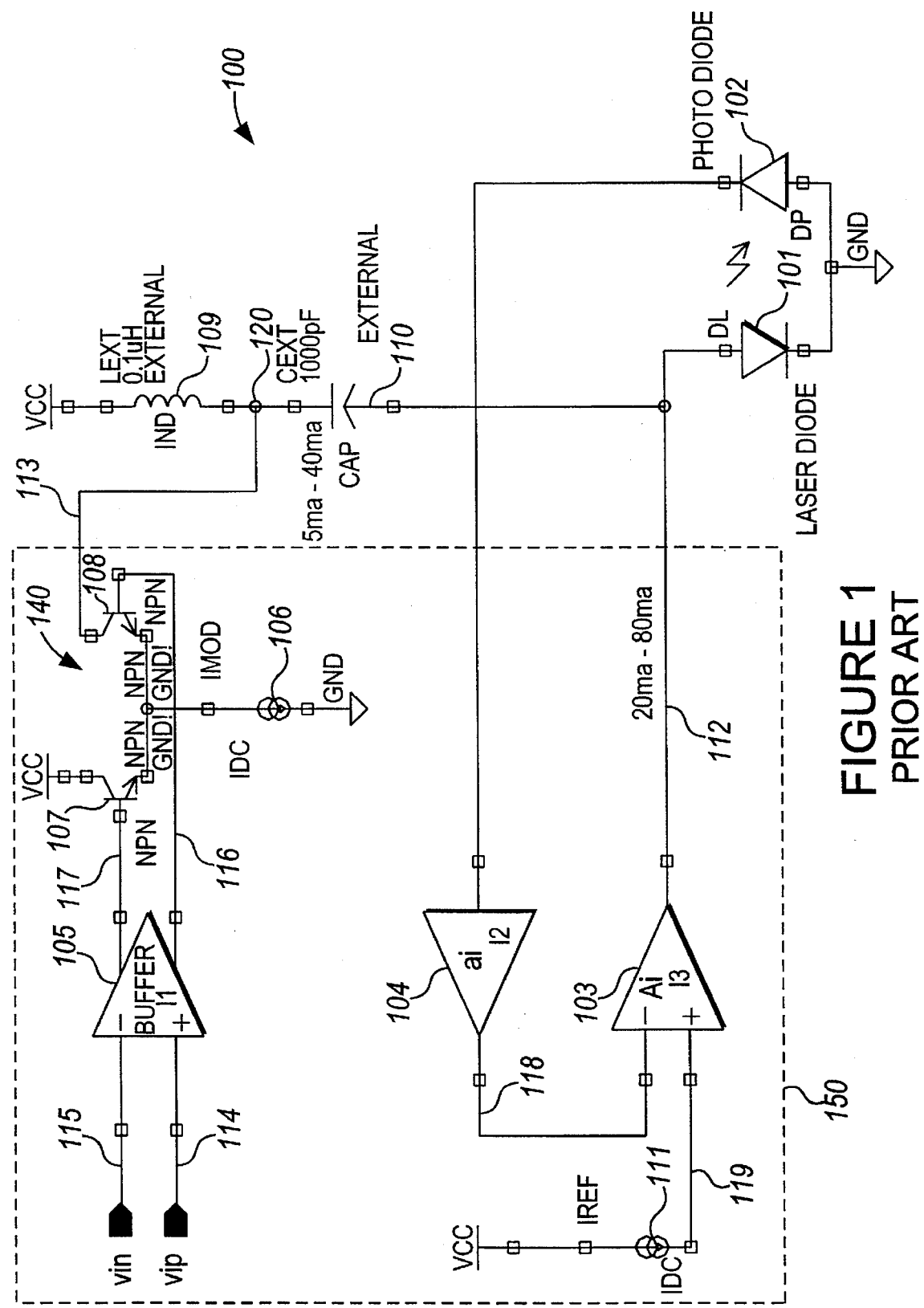
FIG. 1 shows a laser diode 101 driven by an integrated circuit laser diode driver 150 of the prior art.
Figure 2:
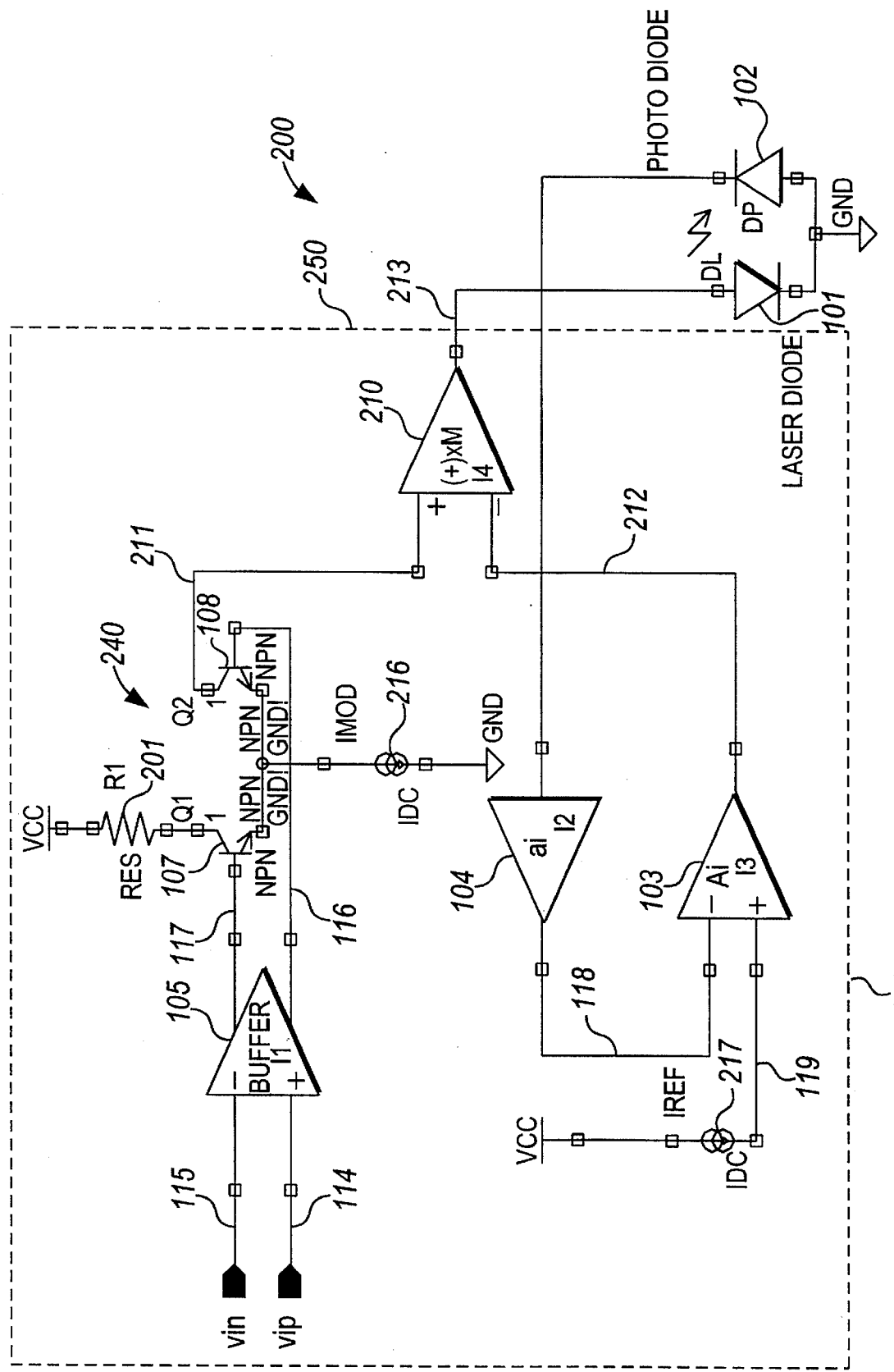
FIG. 2 is a schematic circuit 200 which shows an integrated circuit laser diode driver 250 driving a laser diode 101, in accordance with one embodiment of the present invention.
Figure 3:
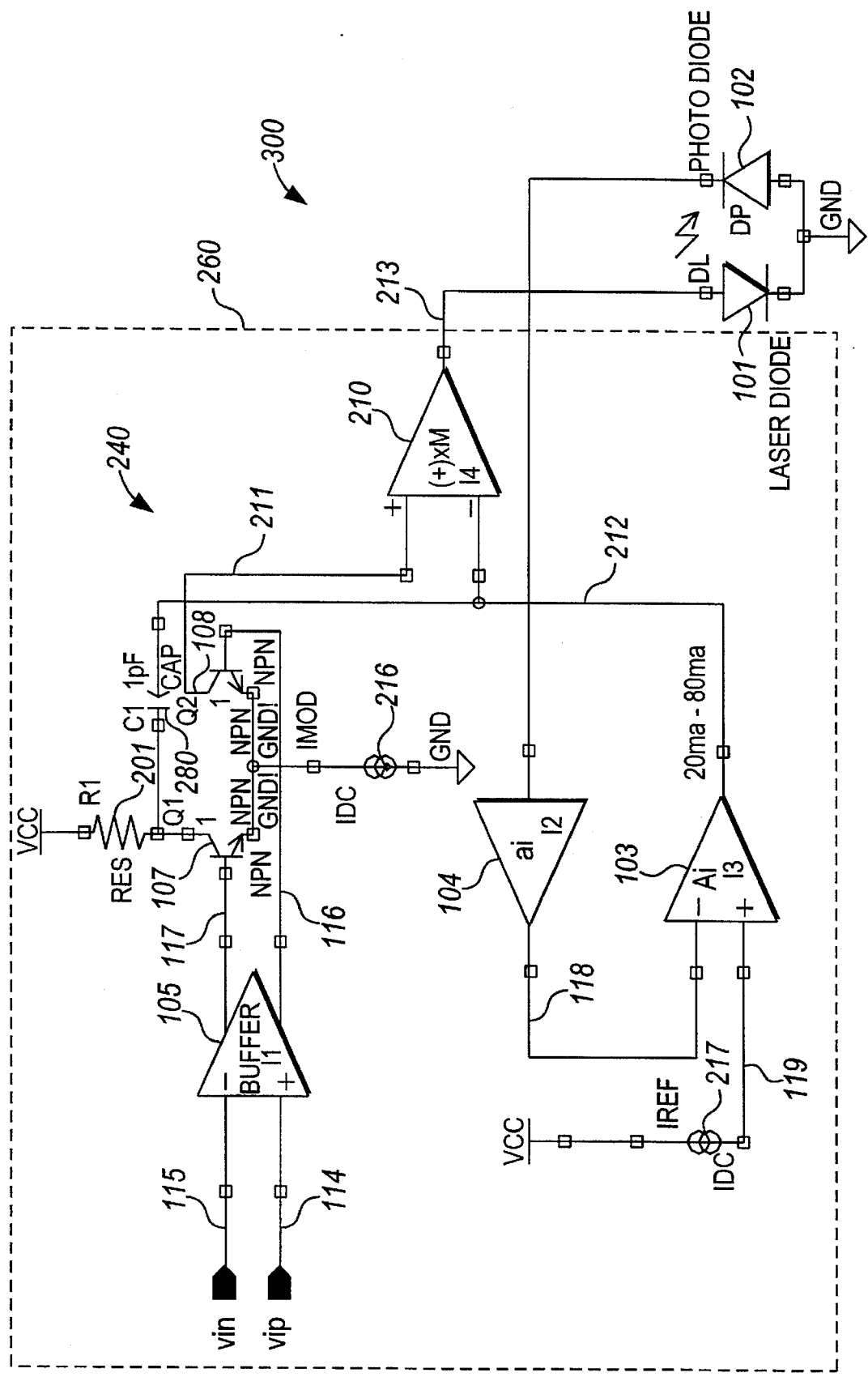
FIG. 3 is a schematic circuit 300, which shows an integrated circuit laser diode driver 260 driving a laser diode 101, in a second embodiment of the present invention.
Figure 4:
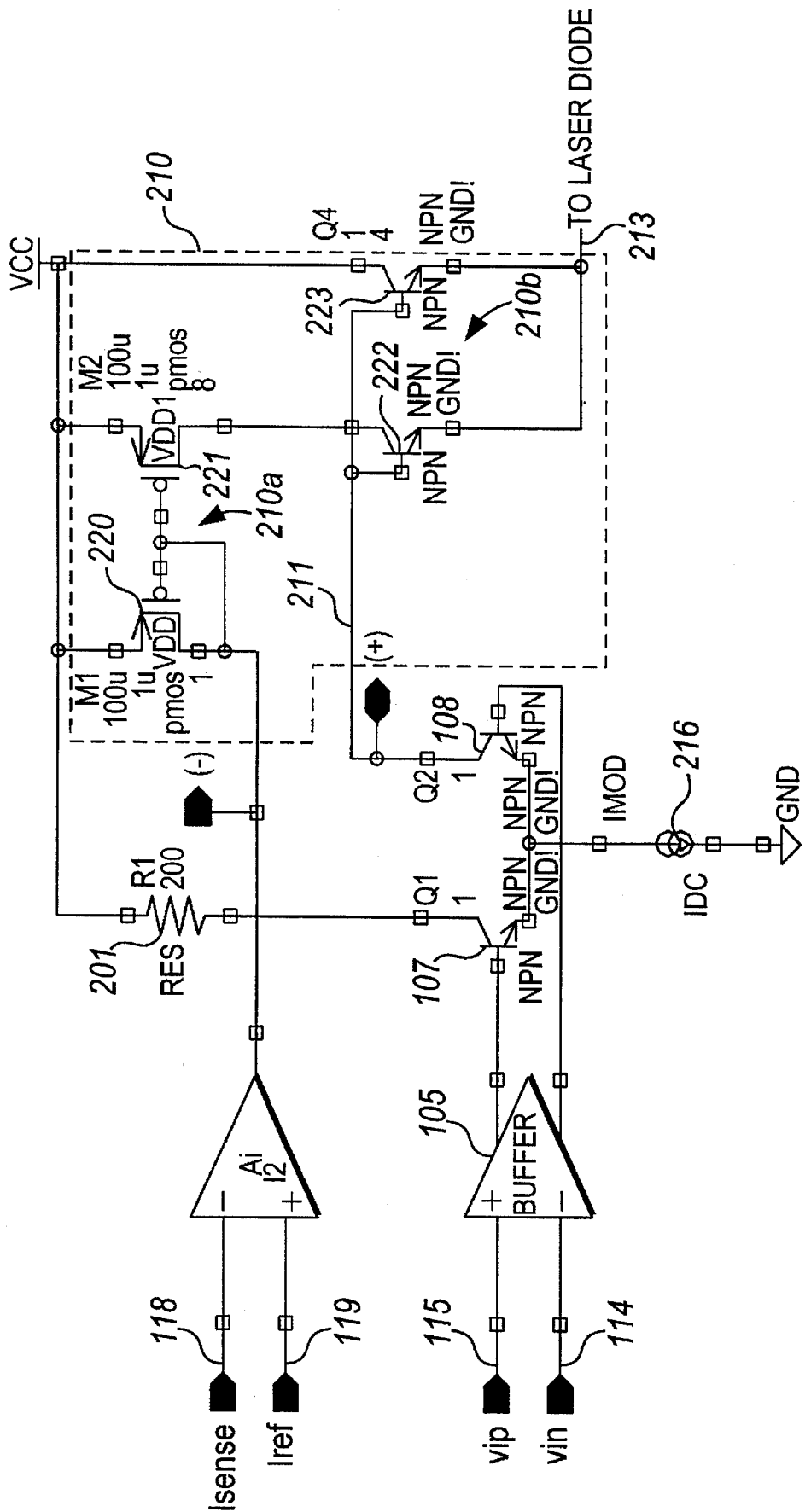
FIG. 4 is a schematic diagram which shows one implementation of amplifier 210.
Figure 5:
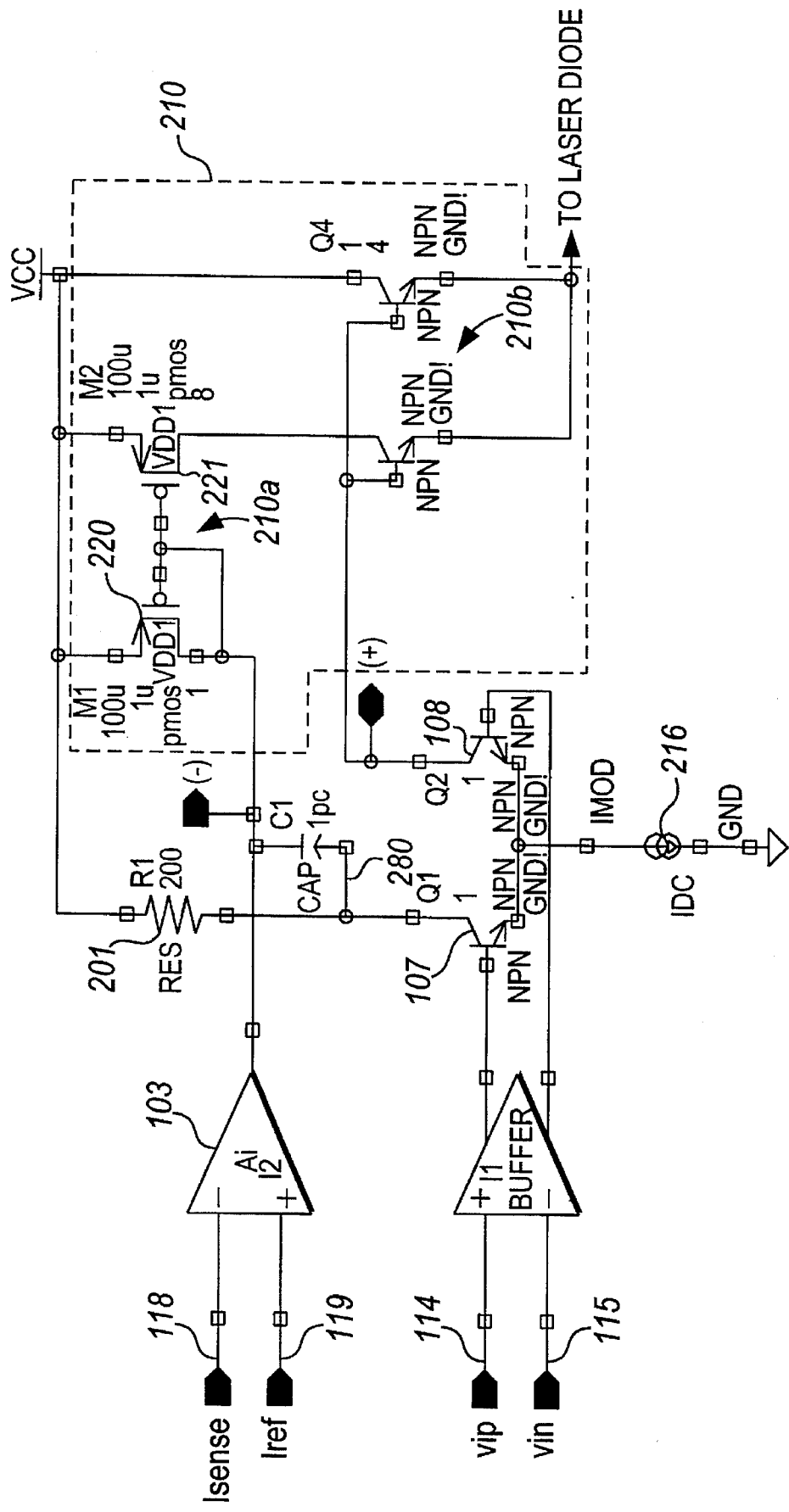
FIG. 5 is a schematic diagram showing a capacitor 280 coupled between the non-inverting input terminal of differential amplifier 210 and an output terminal of differential amplifier 240.

The following detailed description describes two embodiments of the present invention shown in FIGS. 2 and 3. FIGS. 4 and 5 show two implementations of the embodiments shown in FIGS. 2 and 3, respectively. In this detailed description, to minimize repetition, like reference numerals are used to denote like elements. For example, buffer 105 appears in both FIGS. 1 and 2. Thus, unless specifically noted, buffer 105 in both FIGS. 1 and 2 are assumed to perform substantially equivalent functions and can be implemented by like devices.

FIG. 2 is a schematic circuit 200 which shows an integrated circuit laser diode driver 250 driving a laser diode 101, in accordance with one embodiment of the present invention. In FIG. 2, a differential signal to be modulated is provided at input terminals 114 and 115 of buffer 105. The buffered output differential signal is then modulated by differential amplifier 240, which is formed by transistors 107 and 108, and current source 216. Differential amplifier 240 is similar to differential amplifier 140, except that the current in current source 216 can be substantially reduced from that of the corresponding current source 106 in FIG. 1, in accordance with the present invention. A resistor 201 is also shown in circuit 200. Resistor 201 provides a level-shifting function to differential amplifier 240.

Similar to circuit 100 of FIG. 1, prebiasing of laser diode 101 is controlled by differential amplifier 103, which receives a reference current from a reference current source 217 and the feedback current provided by photo diode 104. Unlike circuit 100 of FIG. 1, however, the output prebiasing current ("DC signal") of differential amplifier 103, which is provided at terminal 212, and the output signal ("AC signal") of differential amplifier 240, which is provided at terminal 211, are not directly coupled to laser diode 101. Instead, both the AC and DC signals are coupled to the input terminals of differential amplifier 210, which sum the AC and DC currents to provide an amplified current output at terminal 213 to drive laser diode 101. Because the differential current at terminals 211 and 212 is amplified, reference current source 217 and current source 216 are not required to provide as much current as corresponding current sources 111 and 106 of FIG. 1. The reduced currents of current sources 217 and 216 result in an integrated circuit laser diode driver 250, which has lower power dissipation than the corresponding integrated circuit laser diode driver 150. Using integrated circuit 250, no external component, other than photo diode 102, is required to perform the functions of FIG. 1's circuit 100.

FIG. 4 is a schematic diagram which shows one implementation of amplifier 210. In the implementation shown in FIG. 4, amplifier 210 includes two current mirrors 210a and 210b. As shown in FIG. 4, current mirror 210a is formed by PMOS transistors 220 and 221. Current mirror 210a amplifies the prebiasing current of differential amplifier 103 by the size ratio of PMOS devices 220 and 221. In one embodiment, the size ratio of PMOS transistor 221 is eight times the size of PMOS transistor 220, thereby providing approximately an eight-fold amplification of the prebiasing current.

As shown in FIG. 4, the AC signal on lead 211 is mirrored by npn bipolar transistor 222 on npn bipolar transistor 223. In one implementation, npn bipolar transistor 223 is 4 times the size of npn transistor 222. Since the emitters of npn bipolar transistors 222 and 223 are tied together, the AC signal on terminal 211 is amplified five-folds. In general, if transistor 223 is x times the size of transistor 222, the resulting modulated AC signal in laser diode 101 is approximately (1+x) times the signal at terminal 211.

FIG. 3 is a schematic circuit 300, which shows an integrated circuit laser diode driver 260 driving a laser diode 101 in a second embodiment of the present invention. Circuit 300 differs from circuit 200 by having a capacitor 280 coupled between an output terminal of differential amplifier 240 and the inverting input terminal of differential amplifier 210. Capacitor 280 couples the modulation current in npn transistor 107 to the inverting terminal of differential amplifier 210 to further increase current amplification in differential amplifier 210.

FIG. 5 is a schematic diagram showing an implementation of the embodiment in FIG. 3, in which capacitor 280 is coupled between the inverting input terminal of differential amplifier 210 and an output terminal of differential amplifier 240. As shown in FIG. 5, capacitor 280 couples the modulation current at the collector of npn bipolar transistor 107 to the PMOS transistor 220. This coupling causes in PMOS transistor 220 a modulation of current, which is amplified in PMOS transistor 221. Consequently, the effective gain of differential amplifier 210 is increased, thereby further reducing the current requirement on current source 216.

The above detailed description is provided to illustrate the specific embodiments of the present invention and is not intended to be limiting of the present invention. Numerous variations and modification within the scope of the present invention are possible. The present invention is set forth in the following claims.

I claims:

1. A driver circuit for a laser diode comprising:

a reference current source;

a first amplifier, said first amplifier providing a prebiasing current derived from said reference current source;

a second amplifier receiving an input signal and amplifying said input signal to provide a modulated current signal; and a third amplifier receiving said prebiasing current and said modulated signal for summing said prebiasing current with said modulated signal to provide an output current to flow to said laser diode;

wherein said third amplifier comprises:

a first current mirror for amplifying said prebiasing current; and a second current mirror for amplifying said modulated signal.

2. A driver circuit as in claim 1, wherein said second amplifier comprises an output terminal, and said third amplifier having an inverting input terminal, said driver circuit further comprising a capacitor coupled between said output terminal and said inverting input terminal.

3. A driver circuit as in claim 1, wherein said first current mirror comprises MOS transistors.

4. A driver circuit as in claim 1, wherein said second current mirror comprises bipolar transistors.

5. A method for providing a drive current to a laser diode comprising:

providing a reference current;

outputting a prebiasing current from a first amplifier, said first amplifier deriving said prebiasing current from said reference current;

amplifying an input signal to provide, as an output signal of a second amplifier, a modulated current signal; and providing in a third amplifier an output current to flow to said laser diode, said output current being an amplification of a sum of said prebiasing current and said modulated current signal;

wherein said step of providing in a third amplifier an output current comprises the steps of:

amplifying said prebiasing current using a first current mirror; and amplifying said modulated current signal using a second current mirror.

6. A method for providing a drive current to a laser diode comprising:

outputting a prebiasing current from a first amplifier;

amplifying an input signal to provide, as an output signal of a second amplifier, a modulated current signal; and providing in a third amplifier an output current to flow to said laser diode, said output current being an amplification of a sum of said prebiasing current and said modulated current signal;

wherein said step of providing in a third amplifier an output current comprises the steps of:

amplifying said prebiasing current using a first current mirror; and amplifying said modulated current signal using a second current mirror; wherein said second amplifier comprises an output terminal, and said third amplifier having an inverting input terminal, said method further comprising the step of further increasing current amplification in said third amplifier by a capacitor coupled between said output terminal and said inverting input terminal.

7. A method as in claim 5, wherein said amplifying step using said first current mirror achieves amplification by controlling currents in appropriately sized MOS transistors.

8. A method as in claim 5, wherein said amplifying step using said second current mirror achieves amplification by controlling currents in appropriately sized bipolar transistors.

* * * * *